(12) United States Patent
Lee et al.

(45) Date of Patent: Aug. 9, 2011
(10) Patent No.: US 7,994,823 B2

(54) FLIP-FLOP CIRCUIT HAVING SCAN FUNCTION

(75) Inventors: Hyoung Wook Lee, Seoul (KR); Min-Su Kim, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/795,916

(22) Filed: Jun. 8, 2010

(65) Prior Publication Data
US 2010/0308864 A1    Dec. 9, 2010

(51) Int. Cl.
*H03K 19/096* (2006.01)
(52) U.S. Cl. ............... 326/96; 326/93; 326/95; 326/97
(58) Field of Classification Search ............... None
See application file for complete search history.

(56) References Cited

U.S. PATENT DOCUMENTS

| | | | |
|---|---|---|---|
| 5,764,089 A | 6/1998 | Partovi et al. | |
| 5,898,330 A | 4/1999 | Klass | |
| 6,448,829 B1 * | 9/2002 | Saraf | 327/200 |
| 6,741,113 B1 * | 5/2004 | Tang et al. | 327/208 |
| 7,088,144 B2 * | 8/2006 | Tang et al. | 326/119 |
| 7,157,930 B2 | 1/2007 | Hirata | |
| 7,345,519 B2 | 3/2008 | Hirata | |
| 7,712,002 B2 * | 5/2010 | Baba | 714/726 |

* cited by examiner

*Primary Examiner* — Anh Q Tran
(74) *Attorney, Agent, or Firm* — Stanzione & Kim, LLP

(57) ABSTRACT

A flip-flop circuit having a scan function includes an internal clock generator to receive a clock signal, a scan enable signal, and a first input signal, and to output an internal timing signal based on each of the clock signal, the scan enable signal, and the first input signal. The circuit includes a dynamic input unit to receive a second input signal, the scan enable signal, a first timing signal, and the internal timing signal, and to output a first output signal. The circuit also includes a static output unit to receive the first timing signal and the first output signal and to output a static output signal, and the dynamic input unit outputs the first output signal corresponding to one of the first input signal and the second input signal, respectively, based on a status of the scan enable signal.

34 Claims, 13 Drawing Sheets

FLIP-FLOP CIRCUIT HAVING SCAN FUNCTION

CROSS-REFERENCE TO RELATED APPLICATIONS

This U.S. non-provisional patent application claims priority under 35 U.S.C. §119 of Korean Patent Application No. 10-2009-0050999, filed on Jun. 9, 2009, the entire contents of which are hereby incorporated by reference in its entirety.

BACKGROUND

1. Field of the Invention

The present disclosure herein relates to digital signal processing, and more particularly, to a flip-flop circuit having a scan function.

2. Description of the Related Art

Semiconductor devices, and processors in particular, continue to decrease in size relative to the amount of data processed. As data speed and volume increase, it becomes challenging to keep power consumption of the semiconductor device low.

High-performance circuits may utilize dynamic circuitry to increase processing speed. System clocks have jitter, or variations in high or low levels, especially during rising and falling edges of the clock signal. While static circuitry may be affected by jitter, dynamic circuitry is not affected to the same extent. While static circuitry utilizes signals that are locked in at a rising (or falling) clock signal and held for a duration of a high or low clock period, dynamic circuitry allows a signal to rise or fall during a clock high (or low) period, and the signal is held until the next changing clock edge. For example, in the dynamic circuit if the input signal is low at a rising clock edge but changes to a high level during the high level of the clock, an output signal may be changed to high and held at a high level until the falling edge of the clock. Dynamic logic allows a circuit to operate with a higher processing speed, but may also consume more power than a static logic circuit.

Semi-dynamic flip-flops are capable of dynamically processing inputs to output a static output. In other words, inputs of the semi-dynamic flip-flop may change although the output is held constant until a clock signal triggers the flip-flop, at which point, a value of a dynamic input may become the new output value. Semi-dynamic flip-flops are more efficient than master/slave flip-flops and static pulsed flip-flops. Semi-dynamic flip-flops may be used in a variety of circuits, including translation lookaside buffers (TLB), and arithmetic logic units (ALU). A translation lookaside buffer is a CPU cache that memory management hardware uses to improve virtual address translation speed. An ALU is a digital circuit that performs arithmetic and logical operations and is the building block of central processing units (CPU). Even the simplest microprocessors include ALUs to maintain timers, for example.

Scan testing may be used to test semiconductor chips. In scan-based semiconductor designs, a series of registers may be connected to form serial shift register chains to capture any combinational logic faults among the serially-connected registers.

However, conventional circuits utilizing scan circuitry may require additional hardware, such as additional transistors, which may decrease an output time of the circuit, increase a hold time of a signal, and thus degrade the performance of the circuit.

SUMMARY

The present general inventive concept provides a high-speed semi-dynamic flip-flop including a scan function. Embodiments of the present general inventive concept may implement a semi-dynamic flip-flop circuit having improved performance while maintaining a small surface area on a semiconductor chip or circuit board.

Features and utilities of the present general inventive concept will be set forth in part in the description which follows and, in part, will be obvious from the description, or may be learned by practice of the general inventive concept.

Features and/or utilities of the present general inventive concept may be realized by a flip-flop circuit having a scan function, the flip-flop circuit including an internal clock generator to receive a clock signal, a scan enable signal, and a first input signal, and to output an internal timing signal based on each of the clock signal, the scan enable signal, and the first input signal, a dynamic input unit to receive a second input signal, the scan enable signal, a first timing signal, and the internal timing signal, and to output a first output signal, and a static output unit to receive the first timing signal and the first output signal and to output a static output signal. The dynamic input unit may output the first output signal corresponding to one of the first input signal and the second input signal, respectively, based on a status of the scan enable signal.

The dynamic input unit may include a first NMOS to receive the scan enable signal as a gate input, at least one second NMOS connected parallel to the first NMOS, the second NMOS to receive the second input signal as a gate input, a third NMOS connected in series with the first and second NMOS, the third NMOS to receive the first timing signal as a gate input, and a fourth NMOS connected in series with the third NMOS, the fourth NMOS to receive the internal timing signal as a gate input. The first through fourth NMOS transistors may be connected between the first output signal at one end and ground at the other end.

The at least one second NMOS may include a plurality of NMOS transistors connected to form a complex NMOS gate.

A source of the first NMOS transistor and the at least one second NMOS transistor may each be connected to the electrical node and a drain of each of the first NMOS and the at least one second NMOS may be connected to a source of the third NMOS transistor, a drain of the third NMOS transistor may be connected to a source of the fourth NMOS transistor, and a drain of the fourth NMOS may be connected to ground.

A source of the fourth NMOS transistor may be connected to the electrical node, a source of each of the first NMOS and one of the at least one second NMOS transistors may be connected to a drain of the fourth NMOS transistor, and a source of the fourth NOS may be connected to a drain of each of the first NMOS and one of the at least one second NMOS transistors, and a drain of the fourth NMOS may be connected to ground.

The internal timing signal may be a pulse signal and the internal timing generator may generate the pulse signal based on each of the clock signal, the scan enable signal, and the first input signal.

The internal timing generator may include a first NOR logic gate to receive the first input signal and the scan enable signal and to output an intermediate signal a second NOR gate to receive a delayed clock signal and the intermediate signal and to output the internal timing signal.

The internal timing generator may further include a pair of inverters connected directly in series to receive the clock signal as an input and to output the delayed clock signal.

The internal timing generator may include a first NAND logic gate to receive the first input signal and the scan enable signal and to output a first intermediate signal, a second NAND logic gate to receive a delayed clock signal and the first intermediate signal and to output a second intermediate signal, and a third NAND logic gate to receive the second intermediate signal and the first output signal, and to output the internal timing signal.

The internal timing generator may include a first NAND logic gate to receive the first input signal and the scan enable signal and to output a first intermediate signal, a transmission gate to receive the first intermediate signal and a delayed clock signal as inputs and to output a second intermediate signal to a first electrical node, a PMOS transistor connected between a power source and the first electrical node and having a gate connected to the output of the first NAND logic gate, the PMOS transistor to pre-charge the first electrical node, and an inverter connected to the first electrical node to receive the second intermediate signal and to output the internal timing signal.

The internal timing generator may include a first NAND logic gate to receive the first input signal and the scan enable signal and to output a first intermediate signal, a first inverter to receive the clock signal and to output a delayed clock signal, a second NAND gate to receive the delayed clock signal and the first intermediate signal and to output a second intermediate signal, and a second inverter to receive the second intermediate signal and to output the internal timing signal.

The internal timing generator may include a first NAND logic gate to receive the first input signal and the scan enable signal and to output a first intermediate signal, a second NAND logic gate to receive a delayed clock signal and the first intermediate signal and to output a second intermediate signal, and an inverter to receive the second intermediate signal and to output the internal timing signal.

The static output unit may include a first output latch to receive a signal from the electrical node corresponding to the output of the logic circuit and to output a signal to the electrical node corresponding to the signal received from the electrical node signal and a second output latch to receive the signal from the electrical node and a timing signal and to output an output signal.

The second output latch may include first, second, and third NMOS transistors connected in series between power and ground, the first and third NMOS transistors receiving as gate inputs the signal from the electrical node, and the second NMOS receiving as a gate input signal the timing signal, and two inverters connected input-to-output, a first input-to-output connection connected between a drain of the first NMOS transistor and a source of the second NMOS transistor, and a second input-to-output connection outputting an output signal from the logic circuit.

The timing signal may be the internal timing signal from the control circuit.

The timing signal may be the clock signal.

Features and/or utilities of the present general inventive concept may also be realized by a logic circuit including the flip-flop circuit described above, the logic circuit including at least first and second flip-flop circuits as described above and at least one logic circuit connected to an output of the first flip-flop circuit and having an output connected to an input of the second flip-flop circuit, and the output of the at least one logic circuit is the second input signal of the second flip-flop circuit, and the output of the first flip-flop may be the first input signal of the second flip-flop.

Features and/or utilities of the present general inventive concept may also be realized by a method of performing a multiplexing function in a flip-flop circuit, the method including receiving a first input signal, a scan enable signal, and a clock signal in an internal timing generator and outputting an internal timing signal based on the first signal, the scan enable signal, and the clock signal, receiving the internal timing signal, the scan enable signal, a first timing signal, and a second input signal in a dynamic input unit, and outputting a first output corresponding to one of the first input signal and the second input signal based on a status of the scan enable signal.

The dynamic input unit may include a first NMOS, at least one second NMOS connected parallel to the first NMOS, a third NMOS connected in series with the first and second NMOS, and a fourth NMOS connected in series with the third NMOS. The first through fourth NMOS transistors may be connected between the first output signal at one end and ground at the other end, and the method may further include receiving the scan enable signal as a gate input of the first NMOS transistor, receiving the second input signal as a gate input of the second NMOS transistor, receiving the first timing signal as a gate input of the third NMOS transistor, and receiving the internal timing signal as a gate input of the fourth NMOS transistor.

The internal timing signal may be a pulse signal, and the method may further include generating the pulse signal with the internal timing generator based on each of the clock signal, the scan enable signal, and the first input signal. The internal timing generator may include a first NOR logic gate and a second NOR gate, and the method may further include receiving the first input signal and the scan enable signal at the first NOR logic gate, outputting an intermediate signal from the first NOR logic gate based on the first input signal and the scan enable signal, receiving a delayed clock signal and the intermediate signal at the second NOR gate, and outputting the internal timing signal from the second NOR gate based on the delayed clock signal and the intermediate signal.

The internal timing generator may include a first NAND logic gate, a second NAND logic gate, and a third NAND logic gate, and the method further includes receiving the first input signal and the scan enable signal at the first NAND logic gate and outputting a first intermediate signal from the first NAND logic gate, receiving a delayed clock signal and the first intermediate signal at the second NAND logic gate and outputting a second intermediate signal from the second NAND logic gate, and receiving the second intermediate signal and the first output signal at the third NAND logic gate and outputting the internal timing signal from the third NAND logic gate.

The internal timing generator may include a first NAND logic gate, a transmission gate, a PMOS transistor, and an inverter, and the method may further include receiving the first input signal and the scan enable signal at the first NAND logic gate and outputting a first intermediate signal from the first NAND logic gate, receiving the first intermediate signal and a delayed clock signal as inputs to the transmission gate and outputting a second intermediate signal from the transmission gate to a first electrical node, pre-charging the first electrical node with the PMOS transistor, and receiving the second intermediate signal as an input of the inverter and outputting the internal timing signal as an output of the inverter.

The internal timing generator may include first and second NAND logic gates, and first and second inverters, and the method may further include receiving into the first NAND logic gate the first input signal and the scan enable signal and outputting a first intermediate signal from the first NAND logic gate, receiving into the first inverter the clock signal and outputting a delayed clock signal from the first inverter, receiving into the second NAND gate the delayed clock signal and the first intermediate signal and outputting a second intermediate signal from the second NAND gate, and receiving into a second inverter the second intermediate signal and outputting the internal timing signal from the second inverter.

The internal timing generator may include a first NAND logic gate, a second NAND logic gate, and an inverter, and the method may further include receiving into the first NAND logic gate the first input signal and the scan enable signal and outputting a first intermediate signal from the first NAND logic gate, receiving into the second NAND logic gate a delayed clock signal and the first intermediate signal and outputting a second intermediate signal from the second NAND logic gate, and receiving into the inverter the second intermediate signal and outputting the internal timing signal from the inverter. The static output unit may include a first latch and a second latch, and the method may further include receiving into the first output latch a signal from the electrical node corresponding to the output of the logic circuit, outputting from the first latch a signal corresponding to the signal received from the electrical node signal, and receiving into the second output latch the signal from the electrical node and a timing signal, and outputting from the second latch an output signal.

The second output latch may include first, second, and third NMOS transistors connected in series between power and ground and two inverters connected input-to-output, and the method may further include receiving as gate inputs into the first and third NMOS transistors the signal from the electrical node, receiving as a gate input into the second NMOS transistor the timing signal, receiving as an input into a first input-to-output connection of the two inverters an output from a drain of the first NMOS transistor and a source of the second NMOS transistor, and outputting an output signal from a second input-to-output connection of the two inverters.

BRIEF DESCRIPTION OF THE DRAWINGS

The accompanying drawings are included to provide a further understanding of the general inventive concept, and are incorporated in and constitute a part of this specification. The drawings illustrate exemplary embodiments of the general inventive concept and, together with the description, serve to explain principles of the general inventive concept.

DETAILED DESCRIPTION OF THE EMBODIMENTS

Preferred embodiments of the general inventive concept will be described below in more detail with reference to the accompanying drawings. The embodiments of the general inventive concept may, however, be embodied in different forms and should not be constructed as limited to the embodiments set forth herein. Rather, these embodiments are provided so that this disclosure will be thorough and complete, and will fully convey the scope of the general inventive concept to those skilled in the art. Like numbers refer to like elements throughout.

Figure 1:
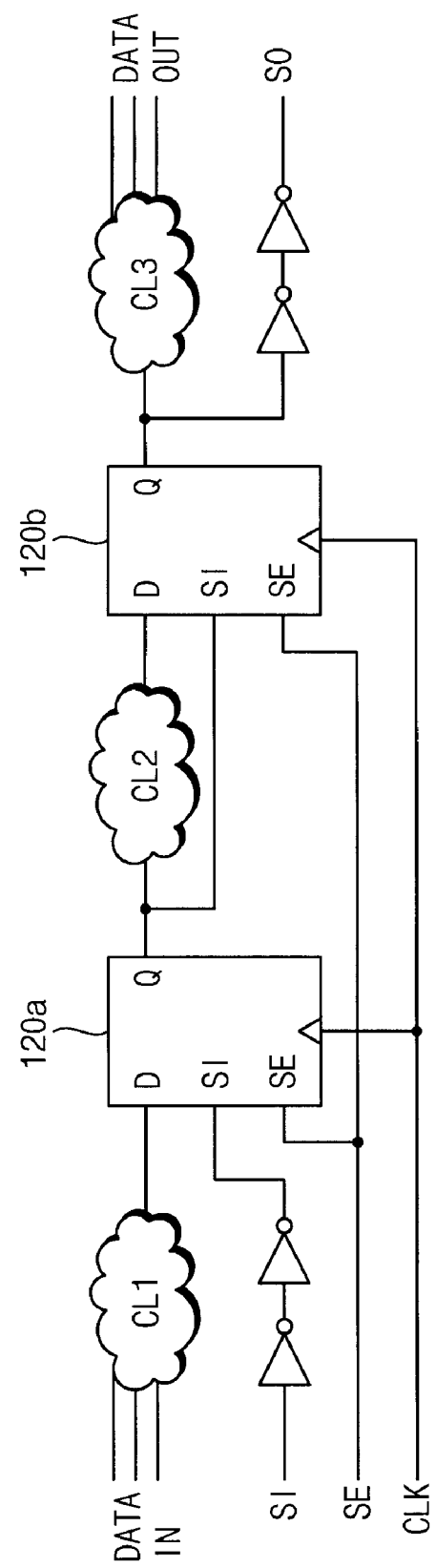
FIG. 1 illustrates a block diagram of flip-flops and circuit logic having scan functionality.

An example of a scan-capable flip-flop circuit is illustrated in FIG. 1.

A plurality of MUX flip-flop registers 120 are connected in series. The flip-flops 120a and 120b have inputs D and outputs Q connected to circuit logic CL1, CL2, and CL3. The circuit logic CL1 located at an input of the first flip-flop 120a receives data in and outputs an output signal to the input D of the flip-flop 120a that corresponds to the input data and the circuit logic CL1. The second circuit logic CL2 receives an input from the output Q of the first flip-flop 120a and outputs data to an input D of the second flip-flop 120b. The third circuit logic CL3 receives as an input the output Q of the second flip-flop 120b and outputs data. Although two flip-flops and three circuit logic portions are illustrated, a scan-function chain of circuit logic and flip-flops may include any number of flip-flops and circuit logic portions.

Each flip-flop 120a and 120b can include a normal input D, an output Q, a scan input SI, a scan enable input SE, and a clock input CLK. During normal operation, the SE signal is disabled, and the flip-flops 120a and 120b operate normally by receiving data as input and outputting data that has passed through the logic circuit. During a test or scan operation, the scan enable SE is asserted, and a predetermined scan input SI signal level is applied to the first flip-flop 120a of the series. Since the scan input signal SI is a predetermined signal, the scan output signal SO can be predicted, and it can be determined whether any faults exist in the flip-flops 120a and 120b in the scan-function chain without taking into account any intervening circuit logic. In other words, the scan function allows testing of the flip-flops 120a and 120b without testing the circuit logic CL1, CL2, and CL3.

Figure 2:
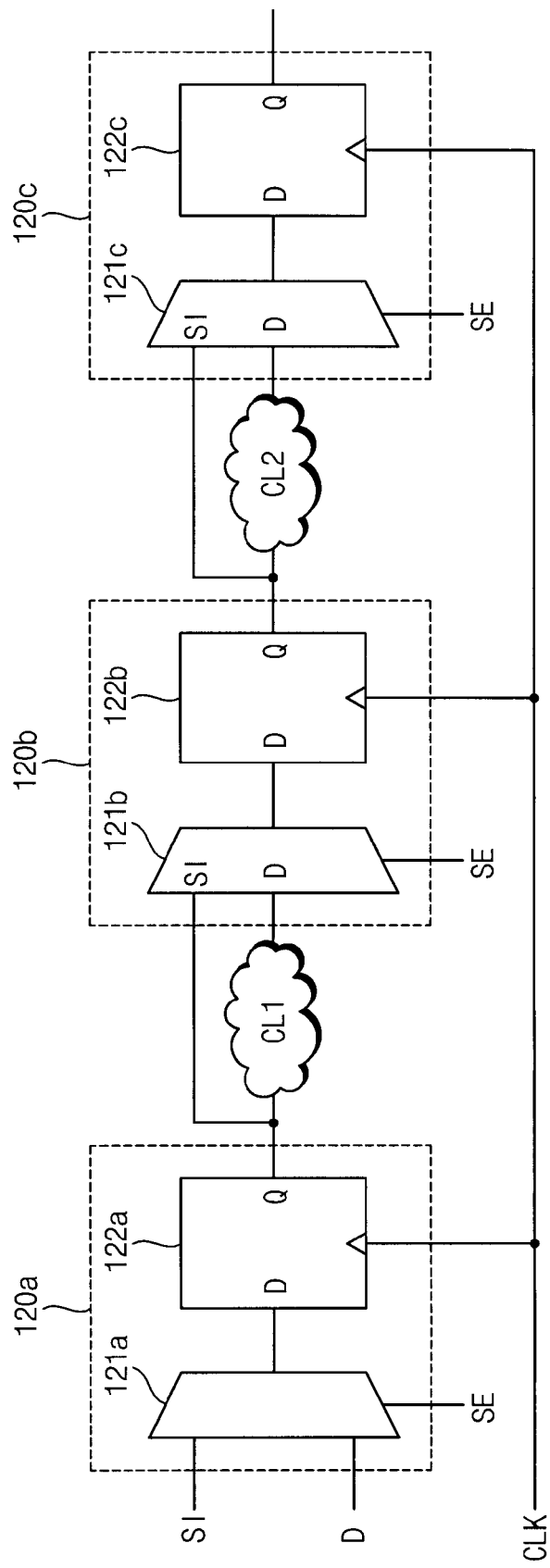
FIG. 2 illustrates a block diagram of a semi-dynamic MUX flip-flops and circuit logic having scan functionality.

FIG. 2 illustrates in further detail the MUX flip-flops 120 of FIG. 1. Each flip-flop circuit 120a, 120b, and 120c includes a MUX 121a, 121b, and 121c, and a flip-flop 122a, 122b, and 122c. When the scan enable signal SE is not asserted, the input signal D is output to the input of the flip flop 122a, 122b, and 122c, respectively. On the other hand, when the scan enable signal SE is asserted, the value of the scan input signal SI is output to the input of the flip-flop 122a, 122b, and 122c, respectively. Since the scan input signal SI is connected to an output Q of each flip-flop 122a and 122b before the output signal Q is input into the next circuit logic CL1 and CL2, the scan function analyzes values of the flip-flops 122a, 122b, and 122c without analyzing the circuit logic CL1 and CL2. Thus, the scan function of a series of flip-flops with intervening circuit logic may be used to test only the flip-flops, and not the circuit logic.

Figure 3:
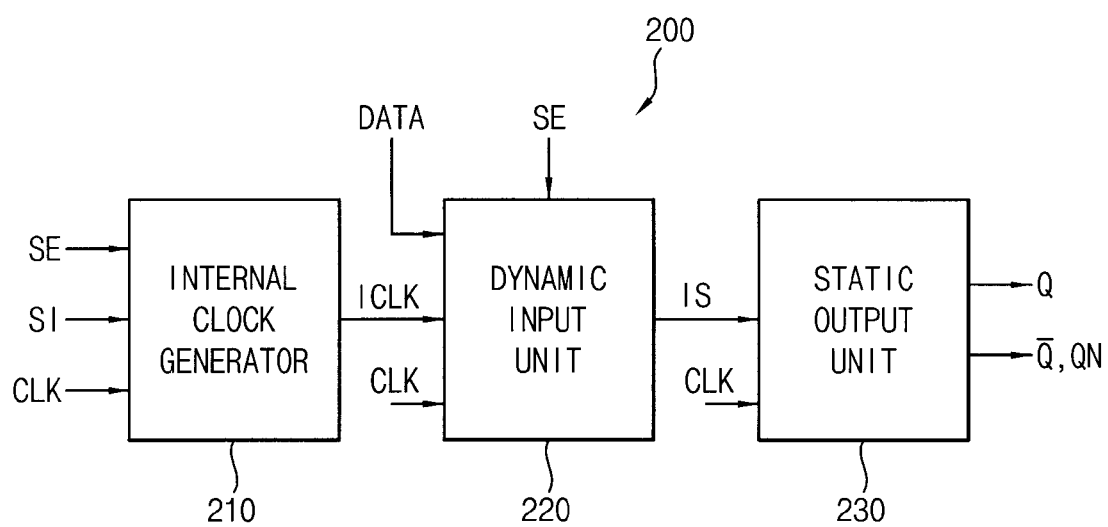
FIG. 3 illustrates a block diagram of a dynamic flip-flop circuit according to an embodiment of the present general inventive concept.

FIG. 3 illustrates a block diagram of a semi-dynamic flip-flop according to an embodiment of the present general inventive concept. The semi-dynamic flip-flop 200 includes an internal clock generator 210 to receive the scan enable signal SE, scan input signal SI, and a system clock signal CLK, and to output an internal clock signal ICLK. The internal clock signal ICLK may be a pulse signal. The internal clock signal ICLK, the clock signal CLK, a data signal DATA, and the scan enable signal SE are input into a dynamic input circuit 220 capable of dynamically analyzing the input data DATA. The dynamic input circuit 220 generates an intermediate signal IS that is fed into a static output circuit 230, such as a latch. The static output circuit 230 also receives the clock signal CLK and outputs an output signal Q, or an inverse output signal QN, based on the intermediate signal IS at a time corresponding to a change in a clock value.

Figure 4A:
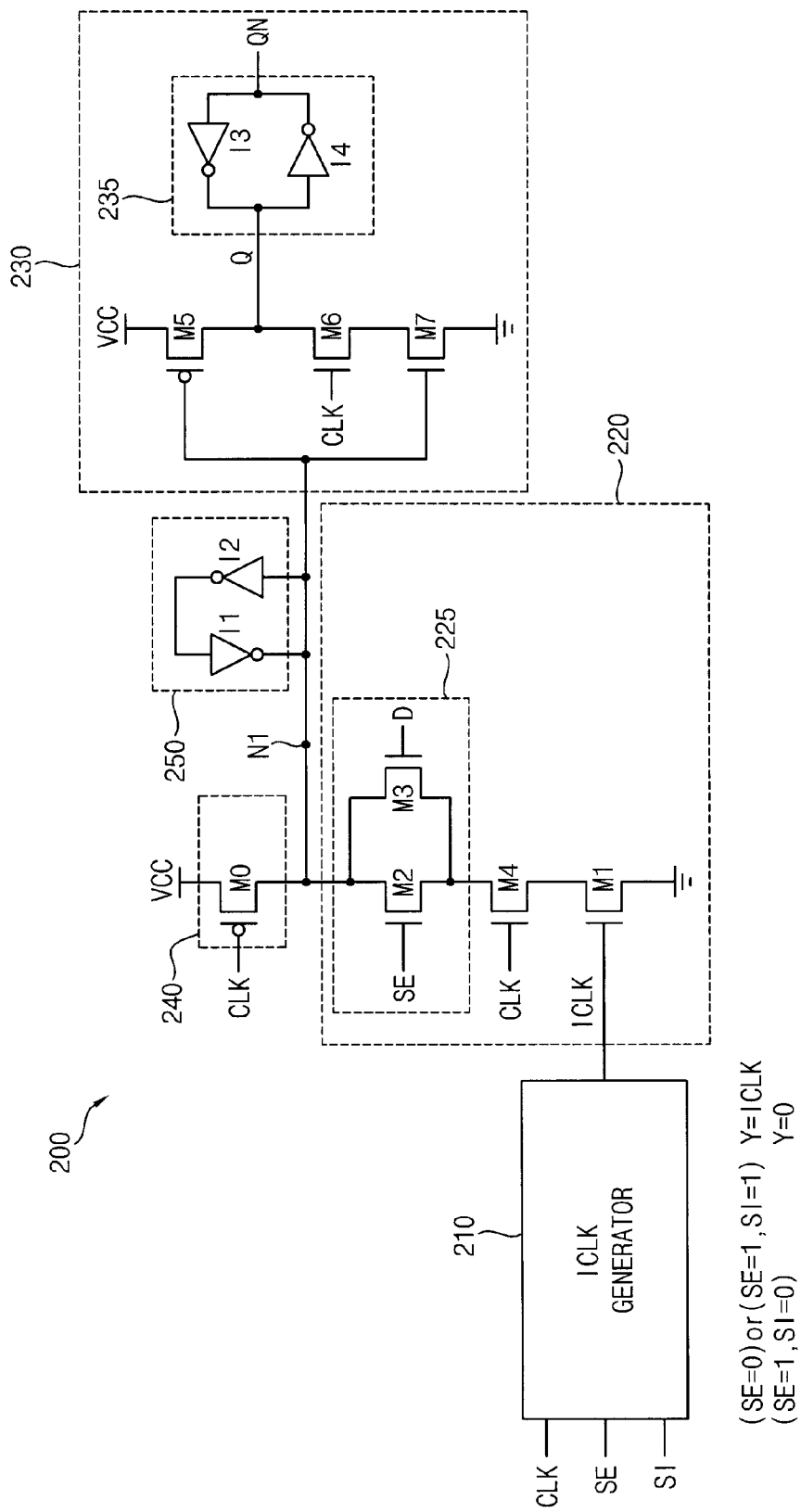
FIGS. 4A-4C illustrate a semi-dynamic flip-flops according to embodiments of the present general inventive concept.

FIG. 4A illustrates in more detail the semi-dynamic flip-flop circuit 200 having a scan function according to an embodiment of the present general inventive concept. The circuit 200 may include an internal clock generator 210 to generate the internal clock signal ICLK, a dynamic input circuit 220 having a MUX function to select between a scan function and a flip-flop function, a pre-charge circuit 240 to pre-charge a node N1, a first latch 250 to latch a value of the node N1, and a static output circuit 230 to latch and maintain a value of the node N1.

The delayed clock generator 210 may receive as inputs a clock signal CLK, a scan enable signal SE, and a scan input signal SI. The scan input signal SI may have a delay smaller than a delay of the input signal D, because the scan input signal SI may propagate through a non-critical path and the input signal D may propagate through a critical path, and the critical path may have gate delays greater than the non-critical path. When a clock signal CLK is low, transistor M0 is enabled, and a power signal is supplied to the node N1 to pre-charge the node at a high level. Regardless of a value of the transistors M2 and M3, the transistor M4 is turned off, so the node N1 is maintained at the high level. In addition, since transistors M5 and M6 of the static output circuit 230 are also turned off, the value of the output Q is maintained at the same level during a negative or low portion of a clock cycle. In other words, if the value of the output Q was high at the end of the clock high signal, the output Q stays high during the clock low signal. Conversely, if the output Q is low at the end of the clock high signal, then the output Q stays low during the clock low signal.

When the clock signal CLK is high, the output Q of the semi-dynamic flip-flop circuit 200 may depend on a value of a scan enable signal SE and a flip-flop input signal D. If the scan enable signal SE is high, then the scan function is enabled, and the output depends on the value of the scan input signal SI that is input to the delayed clock generator 210. Transistors M2 and M4 are turned on, since the scan enable signal SE is high and the clock signal CLK is high. If the scan input signal SI causes the internal clock signal ICLK to be driven high, then transistor M1 is turned on and node N1 is driven low, since a path exists between the node N1 and ground. Output transistors M5 and M6 are turned on, and transistor M7 is turned off, so power is supplied to the output Q via transistor M5, and the output Q is driven high.

On the other hand, if the scan input signal SI causes the internal clock signal ICLK to be driven low, transistor M1 is turned off and node N1 is maintained at a high level. Consequently, output transistor M5 is turned off and transistors M6 and M7 are turned on, driving the output Q low.

If the scan enable signal SE is driven low, then the internal clock generator ICLK may drive the transistor M1 high during a high portion of a clock signal CLK, and the output Q may depend upon the value of the input signal D. If the input signal D is high, then transistor M3 is turned on, node N1 is driven low, and output Q is driven high. If the input signal D is low, then node N1 is maintained high, and the output Q is driven low. The output Q is maintained at the value of the input signal D when the clock signal is low. In other words, whatever the value of the input signal D when the clock low portion of the clock signal begins is the value that is maintained by the output signal Q.

Figure 4B:
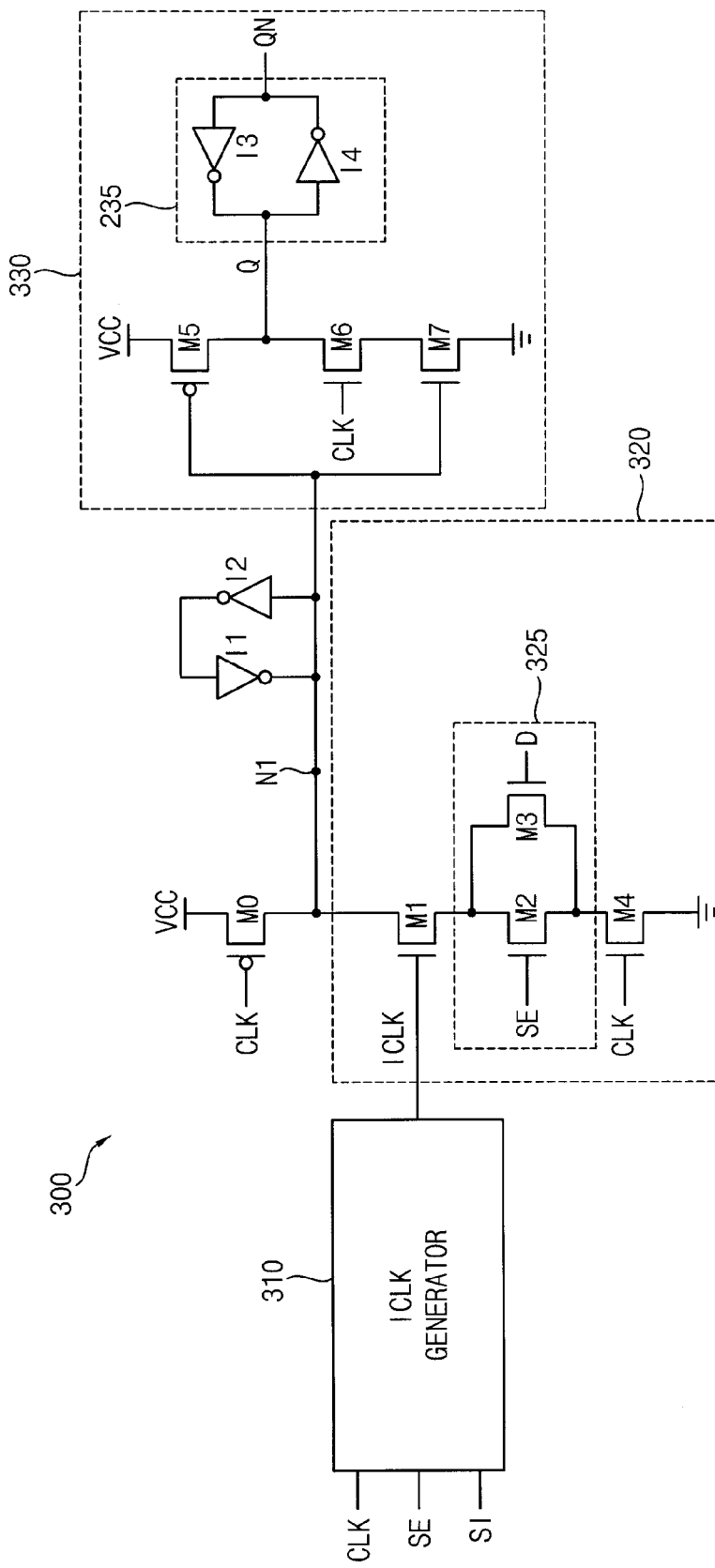

FIG. 4B illustrates a semi-dynamic flip-flop circuit 300 according to another embodiment of the present general inventive concept. The semi-dynamic flip-flop circuit 300 of FIG. 4B is similar to that of FIG. 4A, except the transistor M1 is positioned between the node N1 and the logic circuit 325. The internal clock generator 310, the dynamic input circuit 320, and the static output circuit 330 function similarly to those of FIG. 4A and will not be described in further detail.

Figure 4C:
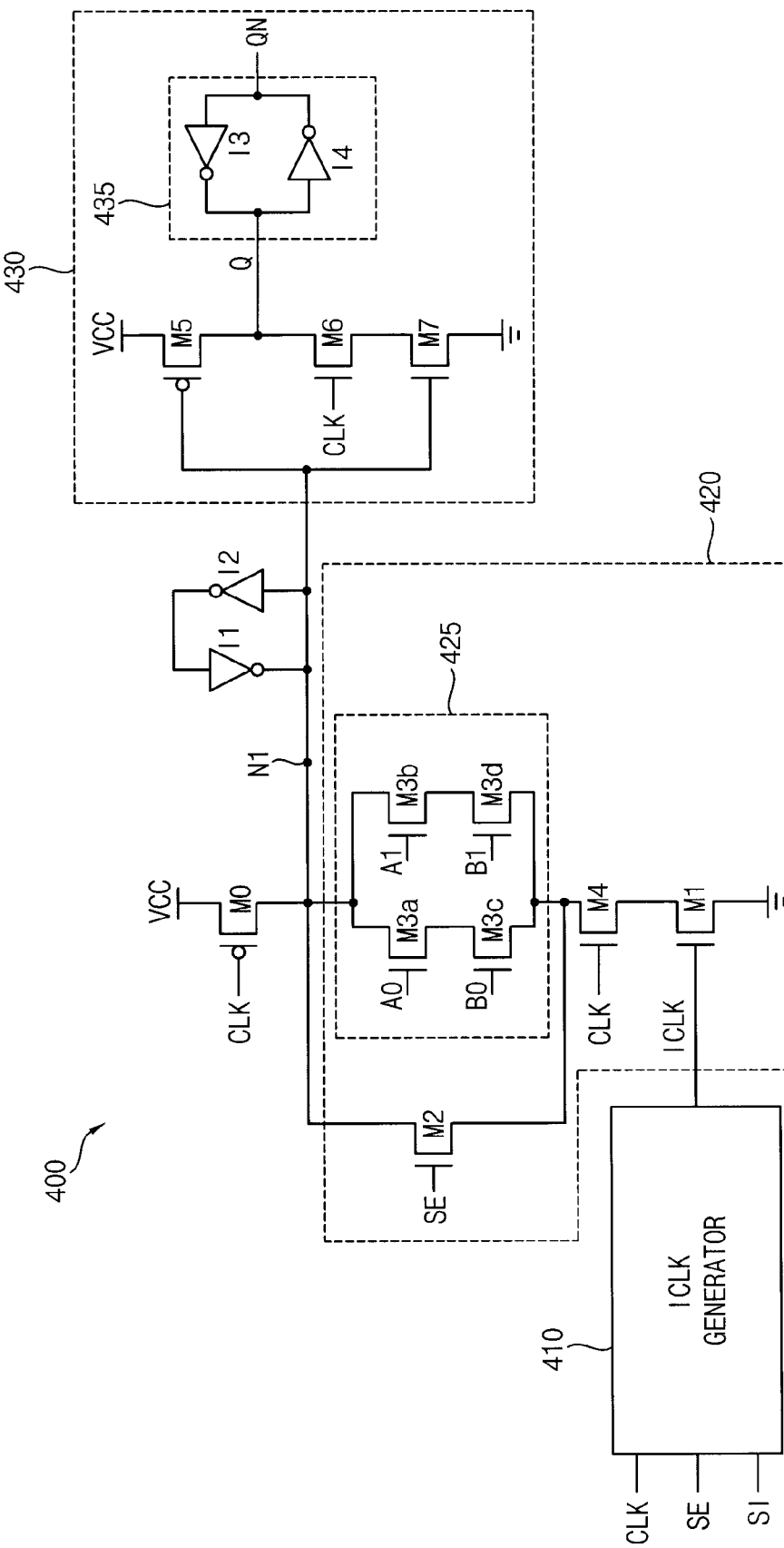

FIG. 4C illustrates a scan-enabled logic gate circuit 400 according to another embodiment of the present general inventive concept. The circuit 400 of FIG. 4C is similar to the circuits 200 and 300 of FIGS. 4A and 4B, except instead of an input D, the circuit 400 of FIG. 4C includes a complex logic gate circuit 425. The circuit 400 of FIG. 4C operates in a manner similar to that of FIG. 4A. During a scan function, the output Q of the circuit 400 outputs the scan input SI value. However, during normal operation, instead of operating as a flip-flop to output a value of an input D, the circuit 500 analyzes the logic input transistors M3a, M3b, M3c, and M3d to determine an output value. For example, FIG. 4C illustrates four NMOS transistors M3a, M3b, M3c, and M3d, each receiving a separate input signal. If both of transistors M3a and M3c are turned on, then the node N1 may be driven low, and the output Q may be driven high. Similarly, if both of transistors M3b and M3d are turned on, then the output Q may be driven high. Thus, transistors M3a and M3c may serve as a first AND gate, transistors M3b and M3d may serve as a second AND gate, and the transistor pairs in parallel may serve to OR the two AND gates.

Although an example is illustrated having four NMOS transistors to form a logic circuit, any number of transistors may be used to generate any desired logical function. The internal clock generator 410, the dynamic input circuit 420, and the static output circuit 430 function similarly to those of FIG. 4A and will not be described in further detail.

Figure 5A:
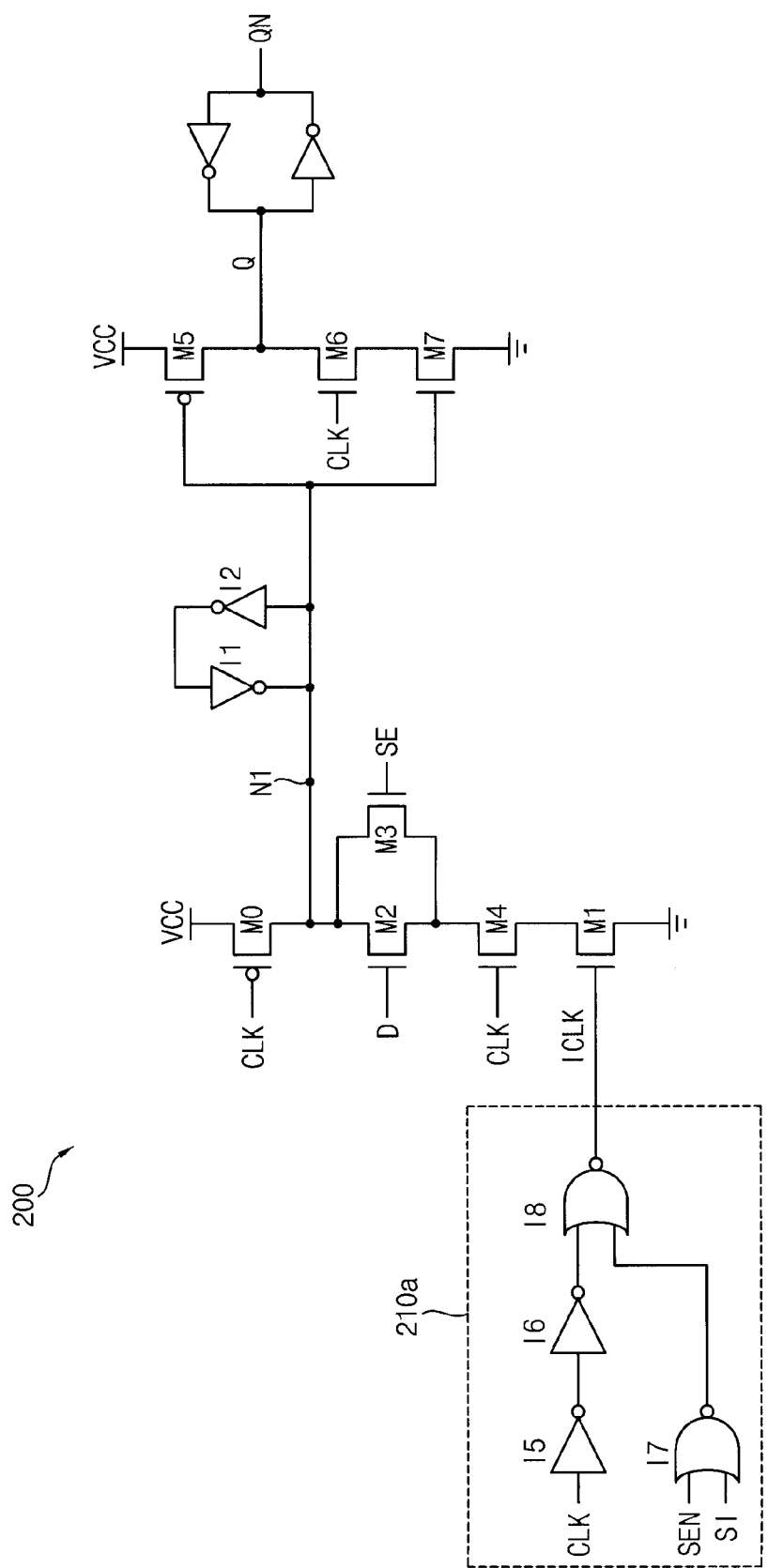
FIGS. 5A-5D illustrate clock generators according to embodiments of the present general inventive concept.

FIGS. 5A-5D illustrate internal clock generator circuits according to the present general inventive concept. In FIG. 5A, the internal clock generator circuit 210a includes a buffer including two inverters I5 and I6, and two NOR gates, I7 and I8. A clock signal CLK is input into a buffer including inverters I5 and I6 to delay the clock signal. An inverse scan enable signal SEN and a scan input signal SI are input into a NOR gate I7, and the delayed clock signal and the output of the NOR gate I7 are input into a NOR gate I8, which outputs the internal clock signal ICLK.

When scan enable SE is asserted, the inverse scan enable signal SEN is low, and the NOR gate I7 outputs a high signal only when the scan input signal SI is also low. If the inverse scan enable signal SEN is low and scan input SI is high, then the NOR gate I7 outputs a low signal. During a scan function, when scan enable SE is asserted, or high, transistor M3 is turned on, transistor M4 is turned on during a clock CLK high, and the transistor M1 is turned on for a duration of a high clock signal that is delayed from the clock signal CLK. In other words, if SI is high, then M1 turns on for a predetermined period of time after transistor M4 turns on. The node N1 is driven low, and the output Q is driven high. When the clock signal CLK goes low, the static output transistor M6 is turned off, and the output value Q is maintained high while the node N1 is pre-charged.

On the other hand, if SE is high and SI is low during a clock CLK high state, then transistor M1 is turned off, node N1 is maintained high, and output Q is driven low. When the clock CLK state changes to low, transistor M6 is turned off, and output Q is maintained at a high state.

When the scan function is disabled by driving the scan enable signal SE low, transistor M3 is turned off. Thus, transistor M2, which receives input D, changes the state of the output Q. In addition, since the inverse scan enable signal SEN is high, the output of the NOR gate I7 remains low and the output of the NOR gate I8 changes to correspond only to the state of the delayed clock signal. As a result, transistor M1 is turned on after the clock signal CLK goes high, but before it goes back to a low state. When D is high, transistor M2 is turned on, and the node N1 is driven low. As a result, the output Q is driven high, and when the clock signal CLK goes low, the output Q is maintained at a high state.

When D is low, transistor M2 is turned off, node N1 remains high, and output Q is driven low. When the clock signal CLK goes low, static output transistors M5 and M6 are turned off, and the output Q is maintained low.

Figure 5B:
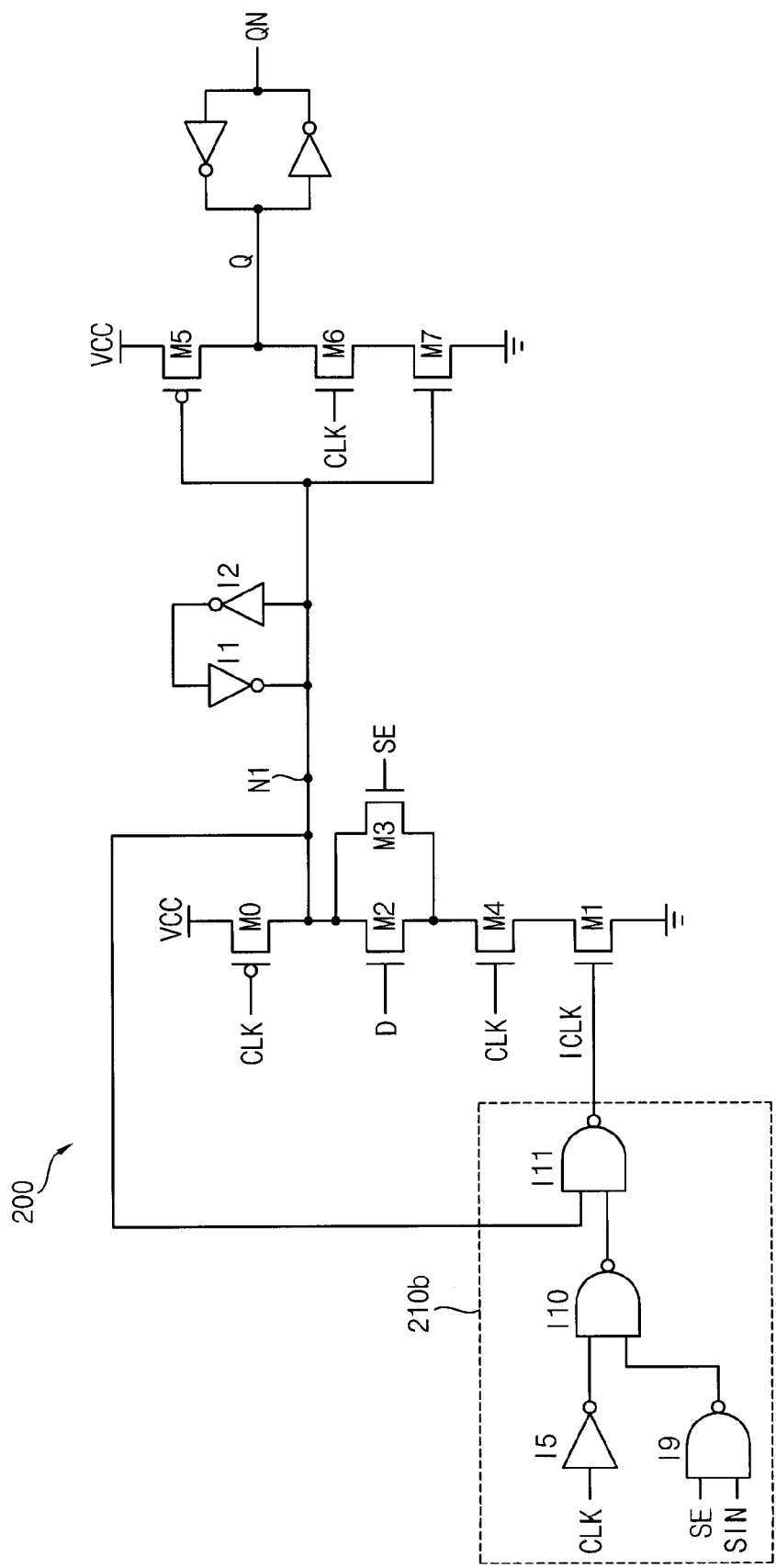

FIG. 5B illustrates an internal clock generation circuit 210b according to another embodiment of the present general inventive concept. In the internal clock generation circuit 210b of FIG. 5B, a scan enable signal SE and an inverse scan input signal SIN are input to a NAND gate I9. A clock signal CLK is input into an inverter I5 and the inverse and delayed clock signal and the output of the NAND gate I9 are input into another NAND gate I10. A NAND gate I11 receives an input from the NAND gate I10 and the node N1 and outputs the internal clock signal ICLK.

During a scan enable function, SE is high, and transistor M3 is turned on. If SI is high, or SIN is low, NAND gate I9 outputs a high signal. NAND gate I10 outputs a low signal when the clock signal CLK is also low so that the signal output from the inverter I5 is high. When NAND gate I10 outputs a low signal, NAND gate I11 outputs a high internal clock signal ICLK, and transistor M1 is turned on. Consequently, node N1 is driven low and output Q is driven high.

If SI is low, and SIN is high, NAND gate I9 outputs a low signal, and NAND gate I10 outputs a high signal regardless of the CLK state. Since node N1 is pre-charged during a low clock state, NAND gate I11 outputs a low signal and M1 is turned off during the low clock state. When the clock state goes high, since M1 is still in a turned-off state, node N1 remains high, and output Q is driven low.

If the scan function is disabled, and the scan enable signal SE is low, transistor M3 is turned off. NAND gate I9 outputs a high signal regardless of the state of SI, and NAND gate I10 outputs a signal that corresponds to the inverse clock signal output from the inverter I5. Thus, if input signal D is high, transistor M2 is turned on, node 1 is driven low, and output Q is driven high. On the other hand, if input D is low, transistor M2 is turned off, node N1 remains in a high state based on its pre-charge level, and output Q is driven low.

Figure 5C:
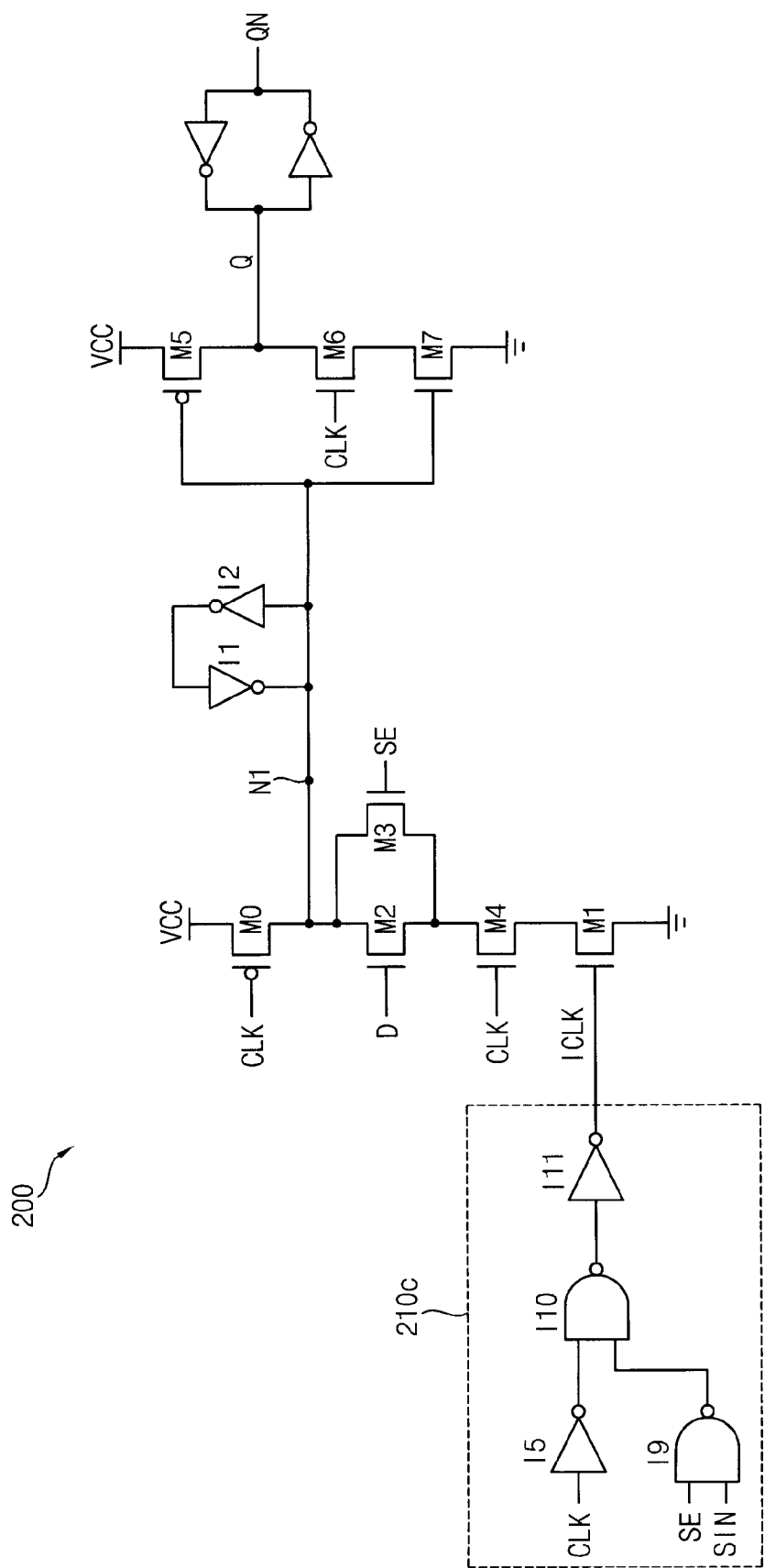

FIG. 5C illustrates another embodiment of an internal clock generator circuit 210c according to the present general inventive concept. The internal clock generator circuit 210c is similar to the internal clock generator circuit 210b of FIG. 5B, except the NAND gate I11 of FIG. 5B is replaced by an inverter I12. The inverter receives as an input the output of the NAND gate I10.

During a scan enable function, SE is high, and transistor M3 is turned on. If SI is high, or SIN is low, NAND gate I9 outputs a high signal. NAND gate I10 outputs a low signal when the clock signal CLK is also low so that the signal output from the inverter I5 is high. When NAND gate I10 outputs a low signal, the inverter I12 outputs a high internal clock signal ICLK, and transistor M1 is turned on. Consequently, node N1 is driven low and output Q is driven high.

If SI is low, and SIN is high, NAND gate I9 outputs a low signal, and NAND gate I10 outputs a high signal regardless of the CLK state. Inverter I12 outputs a low signal and M1 is turned off. When the clock state goes high and transistor M4 is turned on, since M1 is still in a turned-off state, node N1 remains high, and output Q is driven low.

If the scan function is disabled, and the scan enable signal SE is low, transistor M3 is turned off. NAND gate I9 outputs a high signal regardless of the state of SI, and NAND gate I10 outputs a signal that corresponds to the inverse clock signal output from the inverter I5. Thus, if input signal D is high, transistor M2 is turned on, node 1 is driven low, and output Q is driven high. On the other hand, if input D is low, transistor M2 is turned off, node N1 remains in a high state based on its pre-charge level, and output Q is driven low.

Figure 5D:
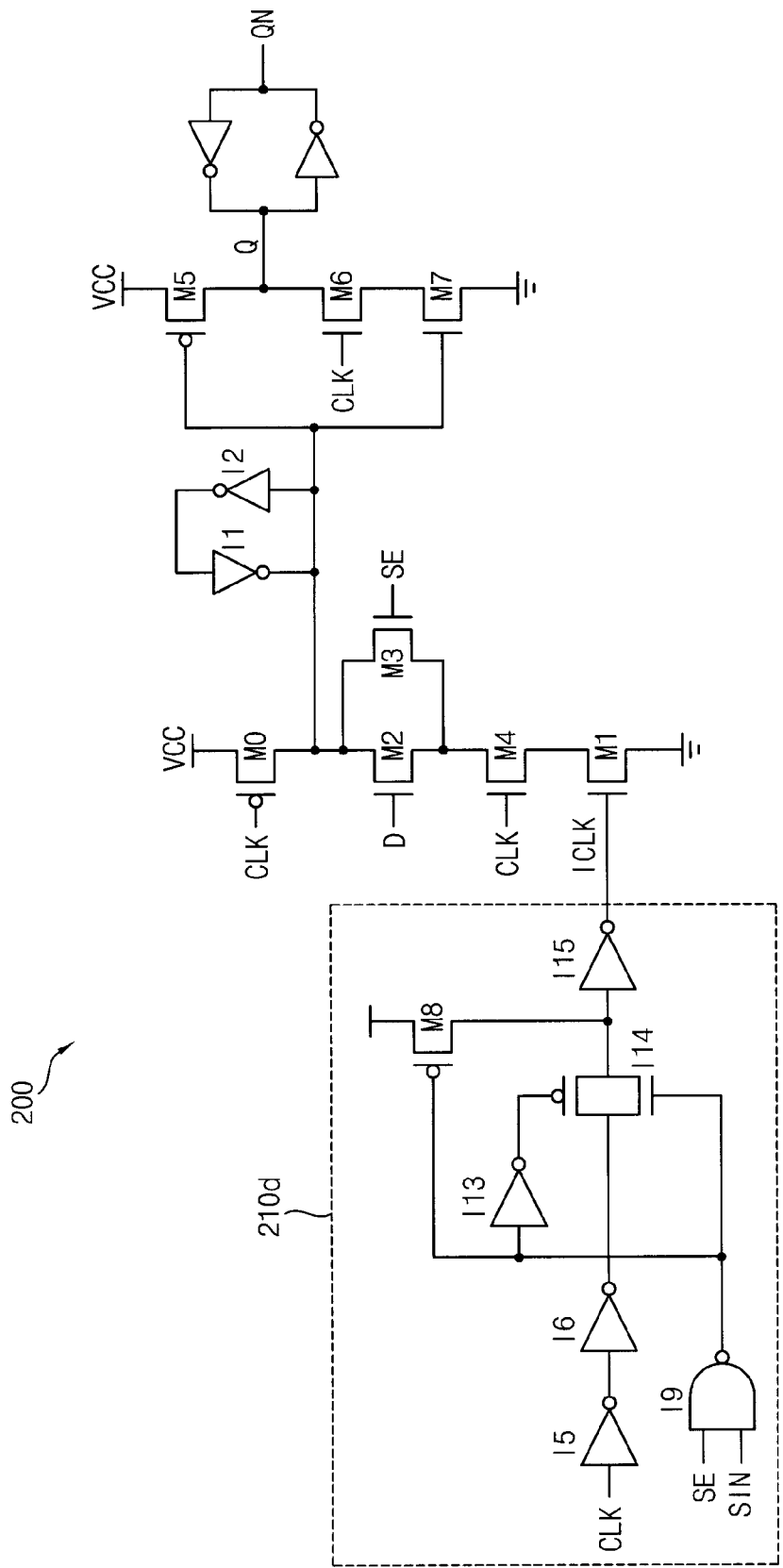

FIG. 5D illustrates an internal clock generator 210d according to another embodiment of the present general inventive concept. The internal clock generator 210d includes a pass gate I14 to pass a delayed clock signal when at least one of the scan enable signal SE and the inverse scan input signal SIN is low. On the other hand, when the scan function is enabled and the inverse scan input signal SIN is high, NAND gate I9 outputs a low signal, transistor M8 is turned on, and the internal clock signal ICLK is driven low. Thus, transistor M1 is turned off, node N1 is maintained at a high state, and the output Q is driven low.

By generating a delayed clock signal to generate the internal clock signal ICLK in the embodiments of each of FIGS. 5A-5D, and by arranging two transistors in series having the ICLK and the CLK signals as gate inputs, respectively, each of the semi-dynamic flip-flop circuits of FIGS. 5A-5D generate implicit pulse signals. In other words, the period of time during which both the clock signal CLK and the ICLK signal based on the delayed clock signal are in the high state may act as a pulse, or a period of time less than that of the full high state of the clock signal CLK to analyze the inputs of the semi-dynamic flip-flop circuits.

Figure 6:
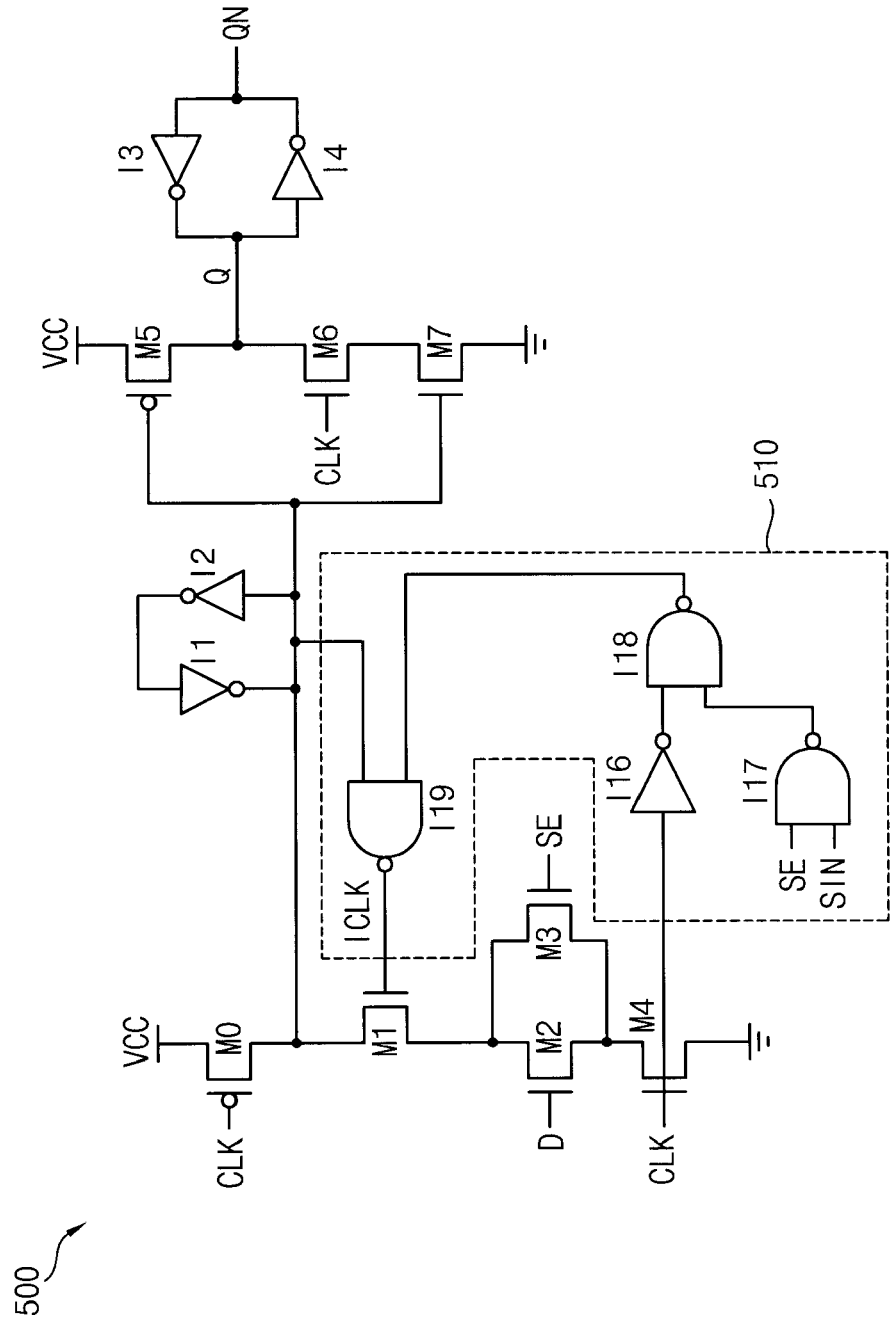
FIG. 6 illustrates a semi-dynamic flip-flop circuit according to an embodiment of the present general inventive concept.

FIG. 6 illustrates a circuit diagram of a semi-dynamic flip-flop circuit 500 according to another embodiment of the present general inventive concept. The semi-dynamic flip-flop circuit 500 is similar to the circuit illustrated in FIG. 4B. The internal clock generating circuit 510 a first inverter I16, a first NAND gate I17 to receive a scan enable signal SE and an inverse scan input signal SIN, a second NAND gate I18 to receive the output from the first inverter I16 and the first NAND gate I17, and a third NAND gate I19 to receive an output of the second NAND gate I18 and having a second input connected to a node N1.

When the scan enable signal SE is high, the scan function may be enabled. When the scan function is enabled, the output of the semi-dynamic output circuit 500 varies according to the inverse scan input signal SIN. For example, if the scan enable signal SE is high and the scan input signal SIN is also high, then the NAND gate I17 is driven low, the NAND gate I18 is driven high, and the transistor M1 is turned off, because the pre-charged node N1 stays at a high level. Consequently, the output Q is driven low to correspond to the SI signal (i.e. the inverse of the SIN signal).

If, on the other hand the scan enable signal SE is high, but the scan input signal SIN is low (i.e. SI is high), then the NAND gate I17 is driven high, and the NAND gate I18 outputs a low signal at each high clock signal CLK. Consequently, transistor M3 is turned on, node N1 is driven low, and the output Q is driven high to correspond to the SI signal.

When the scan function is disabled, the semi-dynamic flip-flop circuit 500 may operate as a flip-flop in which the output Q is determined by the input signal D. With the scan enable signal SE low, the NAND gate I18 is driven low with each low clock signal CLK and high with each high clock signal. The output of the NAND gate I18 is a delayed clock signal. Consequently, immediately after the clock signal CLK switches to a high state, the delayed clock signal remains low for a brief period of time to generate an ICLK pulse. When the clock CLK goes high, transistor M3 is turned on for the period of the pulse of the ICLK signal. If D is high, then the node N1 is driven low, which in turn drives the NAND gate I19 low after the ICLK pulse is over, which in turn maintains the node N1 low during a duration of the high clock state. When the node N1 is driven low, the output Q is driven high, corresponding to the input value D.

When D is low, then when the transistor M3 is turned on during the ICLK pulse, transistors M2 and M3 are turned off, and the node N1 is maintained high. Consequently, the output Q is driven low.

The semi-dynamic flip-flop circuits of the present general inventive concept may utilize fewer NMOS and PMOS transistors than conventional semi-dynamic flip-flop circuits by generating an internal clock signal using a scan enable signal, a scan input signal, and a delayed clock signal. As a result of utilizing fewer transistors, a data capture time of the flip-flop may be improved. In addition, an area necessary to implement the circuit is minimized, a D-Q delay is minimized, and an SI hold time is minimized.

Figure 7:
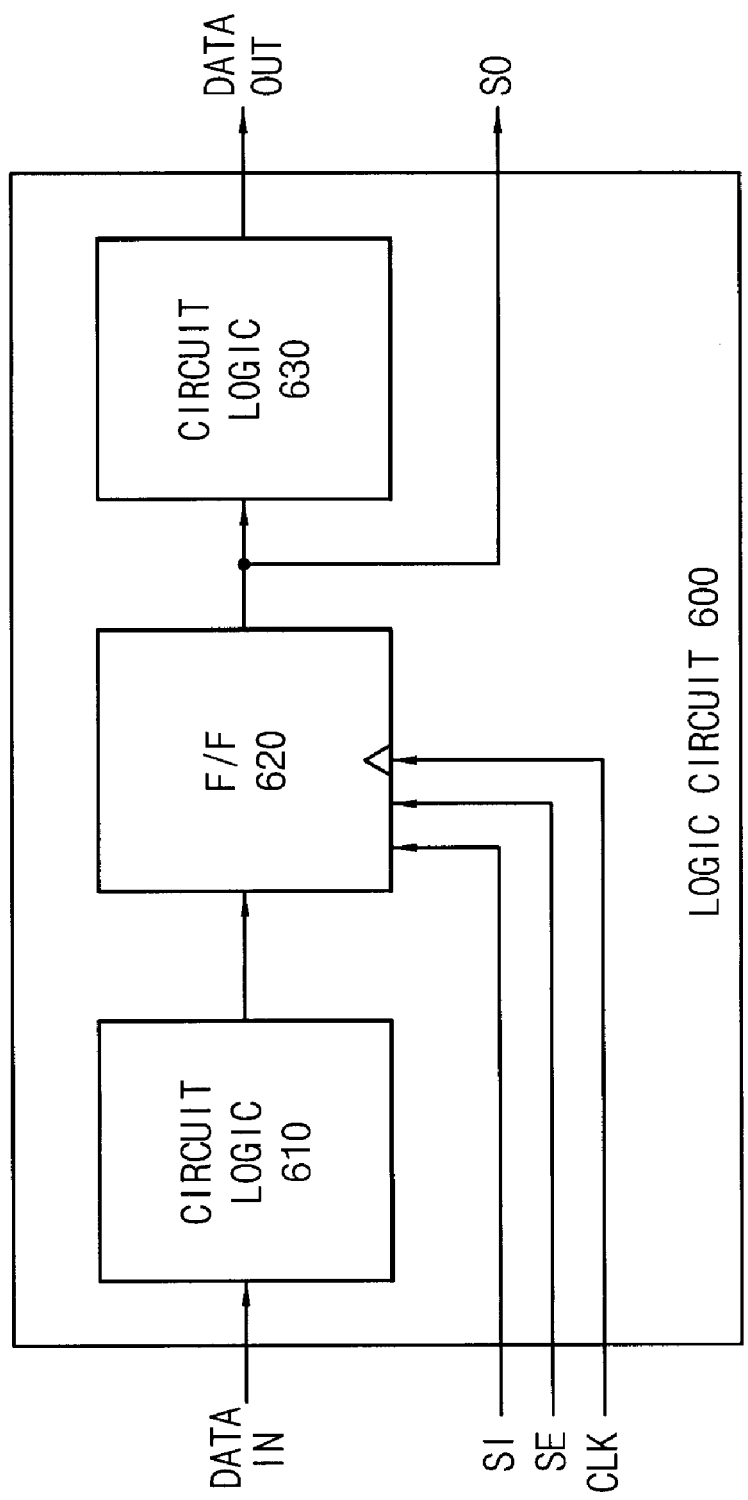
FIG. 7 illustrates a logic circuit including a semi-dynamic flip-flop circuit according to an embodiment of the present general inventive concept.

FIG. 7 illustrates a logic circuit 600 including a semi-dynamic flip-flop circuit according to an embodiment of the present general inventive concept. The logic circuit 600 may be a signal semiconductor chip, such as an ASIC chip, or may include a plurality of separate chips connected on a substrate or a circuit board. The semi-dynamic flip-flop circuit having a scan function may be similar to those illustrated in FIGS. 1 and 2. In other words, the logic circuit 600 may include a plurality of circuit logic elements 610 and 630, each separated by a semi-dynamic flip-flop circuit 620. The logic circuit 600 may receive as inputs data inputs, a scan input signal SI, a scan enable signal SE, and a clock signal CLK. The logic circuit 600 may include data outputs and a scan output signal SO.

As described above, when the logic circuit 600 is used to perform a scan operation, the scan enable signal SE may be driven high, the scan input signal SI may be driven high or low, and the scan output signal SO may be analyzed to determine the results of the scan function. When the logic circuits 610 and 630 are to be utilized without a scan function, the scan enable signal SE may be driven low, and the data out may be analyzed.

Figure 8:
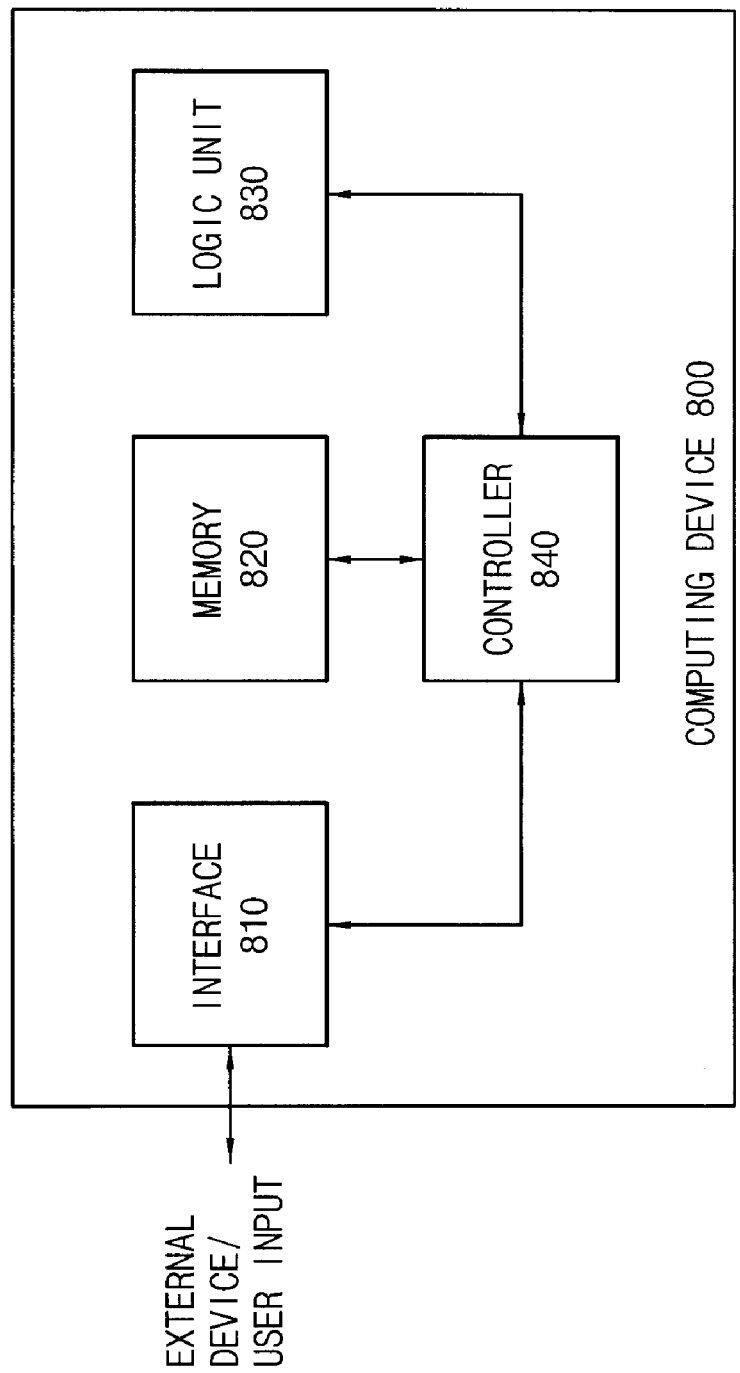
FIG. 8 illustrates a computing device according to the embodiments of present general inventive concept.

The logic circuit 600 of FIG. 7 may be implemented in a computing device 800, as illustrated in FIG. 8. The computing device may include an interface 810 to interface with an external device or a user, a data memory 820 to store data, a logic unit 830 which may correspond to the logic circuit 600 of FIG. 7, and a controller 840 to control operation of each of the functional units of the computing device.

In operation, an external device or a user may input commands to direct the controller 840 to either analyze the logic of the logic unit 830 or to perform a scan function of the logic unit 830. When the scan function is performed, the controller 840 may read the scan output data and may output the results of the scan to the interface 810 via a data port or a display, for example. Alternatively, the controller may be pre-programmed to perform a specific function based on the results of the scan, such as identifying and isolating faulty flip-flops or logic blocks.

Although a few embodiments of the present general inventive concept have been shown and described, it would be appreciated by those skilled in the art that changes may be made in these embodiments without departing from the principles and spirit of the general inventive concept, the scope of which is defined in the claims and their equivalents.

What is claimed is:

1. A flip-flop circuit having a scan function, the flip-flop circuit comprising:
    an internal clock generator to receive a clock signal, a scan enable signal, and a first input signal, and to output an internal timing signal based on each of the clock signal, the scan enable signal, and the first input signal;
    a dynamic input unit to receive a second input signal, the scan enable signal, a first timing signal, and the internal timing signal, and to output a first output signal, the dynamic input unit including at least two MOS transistors connected in parallel, the scan enable signal connected to a gate of one of the at least two MOS transistors and the second input signal connected to a gate of the other of the at least two MOS transistors; and
    a static output unit to receive the first timing signal and the first output signal and to output a static output signal,
    wherein the dynamic input unit outputs the first output signal corresponding to one of the first input signal and the second input signal, respectively, based on a status of the scan enable signal.

2. The flip-flop circuit according to claim 1, wherein the at least two MOS transistors are first and at least one second NMOS, and
    the dynamic input unit comprises:
        the first NMOS to receive the scan enable signal as a gate input;
        the at least one second NMOS connected parallel to the first NMOS, the second NMOS to receive the second input signal as a gate input;
        a third NMOS connected in series with the first and second NMOS, the third NMOS to receive the first timing signal as a gate input; and
        a fourth NMOS connected in series with the third NMOS, the fourth NMOS to receive the internal timing signal as a gate input,
    wherein the first through fourth NMOS transistors are connected between the first output signal at one end and ground at the other end.

3. The flip-flop circuit according to claim 2, wherein the at least one second NMOS includes a plurality of NMOS transistors connected to form a complex NMOS gate.

4. The flip-flop circuit according to claim 2, wherein:
    a source of the first NMOS transistor and the at least one second NMOS transistor are each connected to the electrical node and a drain of each of the first NMOS and the at least one second NMOS is connected to a source of the third NMOS transistor,
    a drain of the third NMOS transistor is connected to a source of the fourth NMOS transistor, and
    a drain of the fourth NMOS is connected to ground.

5. The flip-flop circuit according to claim 2, wherein:
    a source of the fourth NMOS transistor is connected to the electrical node,
    a source of each of the first NMOS and one of the at least one second NMOS transistors is connected to a drain of the fourth NMOS transistor, and a source of the fourth NMOS is connected to a drain of each of the first NMOS and one of the at least one second NMOS transistors, and a drain of the fourth NMOS is connected to ground.

6. The flip-flop circuit according to claim 1, wherein:
the internal timing signal is a pulse signal, and
the internal clock generator generates the pulse signal based on each of the clock signal, the scan enable signal, and the first input signal.

7. The flip-flop circuit according to claim 1, wherein the internal clock generator comprises:
a first NOR logic gate to receive the first input signal and the scan enable signal and to output an intermediate signal; and
a second NOR gate to receive a delayed clock signal and the intermediate signal and to output the internal timing signal.

8. The flip-flop circuit according to claim 7, wherein the internal clock generator further comprises:
a pair of inverters connected directly in series to receive the clock signal as an input and to output the delayed clock signal.

9. The flip-flop circuit according to claim 1, wherein the internal clock generator comprises:
a first NAND logic gate to receive the first input signal and the scan enable signal and to output a first intermediate signal;
a second NAND logic gate to receive a delayed clock signal and the first intermediate signal and to output a second intermediate signal; and
a third NAND logic gate to receive the second intermediate signal and the first output signal, and to output the internal timing signal.

10. The flip-flop circuit according to claim 1, wherein the internal clock generator comprises:
a first NAND logic gate to receive the first input signal and the scan enable signal and to output a first intermediate signal;
a transmission gate to receive the first intermediate signal and a delayed clock signal as inputs and to output a second intermediate signal to a first electrical node;
a PMOS transistor connected between a power source and the first electrical node, and having a gate connected to the output of the first NAND logic gate, the PMOS transistor to pre-charge the first electrical node; and
an inverter connected to the first electrical node to receive the second intermediate signal and to output the internal timing signal.

11. The flip-flop circuit according to claim 1, wherein the internal clock generator comprises:
a first NAND logic gate to receive the first input signal and the scan enable signal and to output a first intermediate signal;
a first inverter to receive the clock signal and to output a delayed clock signal;
a second NAND gate to receive the delayed clock signal and the first intermediate signal and to output a second intermediate signal; and
a second inverter to receive the second intermediate signal and to output the internal timing signal.

12. The flip-flop circuit according to claim 1, wherein the internal clock generator comprises:
a first NAND logic gate to receive the first input signal and the scan enable signal and to output a first intermediate signal;
a second NAND logic gate to receive a delayed clock signal and the first intermediate signal and to output a second intermediate signal; and
an inverter to receive the second intermediate signal and to output the internal timing signal.

13. The flip-flop circuit according to claim 1, wherein the static output unit comprises:
a first output latch to receive a signal from the electrical node corresponding to the output of the logic circuit and to output a signal to the electrical node corresponding to the signal received from the electrical node signal; and
a second output latch to receive the signal from the electrical node and a timing signal and to output an output signal.

14. The flip-flop circuit according to claim 13, wherein the second output latch comprises:
first, second, and third MOS transistors connected in series between power and ground, the first and third MOS transistors receiving as gate inputs the signal from the electrical node, and the second MOS receiving as a gate input signal the timing signal; and
two inverters connected input-to-output, a first input-to-output connection connected between a drain of the first MOS transistor and a source of the second MOS transistor, and a second input-to-output connection outputting an output signal from the logic circuit.

15. The flip-flop according to claim 14, wherein the timing signal is the internal timing signal from the control circuit.

16. The flip-flop circuit according to claim 14, wherein the timing signal is the clock signal.

17. A logic circuit including the flip-flop circuit according to claim 1, the logic circuit comprising:
at least first and second flip-flop circuits, each corresponding to the flip-flop circuit having the scan function according to claim 1; and
at least one logic circuit connected to an output of the first flip-flop circuit and having an output connected to an input of the second flip-flop circuit,
wherein the output of the at least one logic circuit is the second input signal of the second flip-flop circuit, and the output of the first flip-flop is the first input signal of the second flip-flop.

18. A method of performing a multiplexing function in a flip-flop circuit, the method comprising:
receiving a first input signal, a scan enable signal, and a clock signal in an internal timing generator and outputting an internal timing signal based on the first signal, the scan enable signal, and the clock signal;
receiving the internal timing signal, the scan enable signal, a first timing signal, and a second input signal in a dynamic input unit that includes a first MOS transistor and at least one second MOS transistor connected in parallel, the scan enable signal being received at a gate of the first MOS transistor and the second input signal being received at a gate of the at least one second MOS transistor; and
outputting a first output corresponding to one of the first input signal and the second input signal based on a status of the scan enable signal.

19. The method according to claim 18, wherein the first MOS transistor is a first NMOS and the at least one second MOS transistor is at least one second NMOS, and
the dynamic input unit comprises:
a third NMOS connected in series with the first and the at least one second NMOS; and
a fourth NMOS connected in series with the third NMOS, wherein the first through fourth NMOS transistors are connected between the first output signal at one end and ground at the other end, and the method further comprises:

receiving the first timing signal as a gate input of the third NMOS transistor; and receiving the internal timing signal as a gate input of the fourth NMOS transistor.

20. The method according to claim 18, wherein:

the internal timing signal is a pulse signal, and the method further comprises:

generating the pulse signal with the internal timing generator based on each of the clock signal, the scan enable signal, and the first input signal.

21. The method according to claim 18, wherein the internal timing generator comprises:

a first NOR logic gate and a second NOR gate, and the method further comprises:

receiving the first input signal and the scan enable signal at the first NOR logic gate;

outputting an intermediate signal from the first NOR logic gate based on the first input signal and the scan enable signal;

receiving a delayed clock signal and the intermediate signal at the second NOR gate; and outputting the internal timing signal from the second NOR gate based on the delayed clock signal and the intermediate signal.

22. The method according to claim 18, wherein the internal timing generator comprises:

a first NAND logic gate, a second NAND logic gate, and a third NAND logic gate, and the method further comprises:

receiving the first input signal and the scan enable signal at the first NAND logic gate and outputting a first intermediate signal from the first NAND logic gate;

receiving a delayed clock signal and the first intermediate signal at the second NAND logic gate and outputting a second intermediate signal from the second NAND logic gate; and receiving the second intermediate signal and the first output signal at the third NAND logic gate and outputting the internal timing signal from the third NAND logic gate.

23. The method according to claim 18, wherein the internal timing generator comprises:

a first NAND logic gate, a transmission gate, a PMOS transistor, and an inverter, and the method further comprises:

receiving the first input signal and the scan enable signal at the first NAND logic gate and outputting a first intermediate signal from the first NAND logic gate;

receiving the first intermediate signal and a delayed clock signal as inputs to the transmission gate and outputting a second intermediate signal from the transmission gate to a first electrical node;

pre-charging the first electrical node with the PMOS transistor; and receiving the second intermediate signal as an input of the inverter and outputting the internal timing signal as an output of the inverter.

24. The method according to claim 18, wherein the internal timing generator comprises:

first and second NAND logic gates; and first and second inverters, and the method further comprises:

receiving into the first NAND logic gate the first input signal and the scan enable signal and outputting a first intermediate signal from the first NAND logic gate;

receiving into the first inverter the clock signal and outputting a delayed clock signal from the first inverter;

receiving into the second NAND gate the delayed clock signal and the first intermediate signal and outputting a second intermediate signal from the second NAND gate; and receiving into a second inverter the second intermediate signal and outputting the internal timing signal from the second inverter.

25. The method according to claim 18, wherein the internal timing generator comprises:

a first NAND logic gate;

a second NAND logic gate; and an inverter, and the method further comprises:

receiving into the first NAND logic gate the first input signal and the scan enable signal and outputting a first intermediate signal from the first NAND logic gate;

receiving into the second NAND logic gate a delayed clock signal and the first intermediate signal and outputting a second intermediate signal from the second NAND logic gate; and receiving into the inverter the second intermediate signal and outputting the internal timing signal from the inverter.

26. The method according to claim 18, wherein the static output unit includes a first latch and a second latch, and the method further comprises:

receiving into the first output latch a signal from the electrical node corresponding to the output of the logic circuit;

outputting from the first latch a signal corresponding to the signal received from the electrical node signal;

receiving into the second output latch the signal from the electrical node and a timing signal; and outputting from the second latch an output signal.

27. The method according to claim 26, wherein the second output latch comprises:

first, second, and third NMOS transistors connected in series between power and ground; and two inverters connected input-to-output, and the method further comprises:

receiving as gate inputs into the first and third NMOS transistors the signal from the electrical node;

receiving as a gate input into the second NMOS transistor the timing signal;

receiving as an input into a first input-to-output connection of the two inverters an output from a drain of the first NMOS transistor and a source of the second NMOS transistor; and outputting an output signal from a second input-to-output connection of the two inverters.

28. The method according to claim 27, wherein the timing signal is the internal timing signal from the control circuit.

29. The method according to claim 27, wherein the timing circuit is the clock signal.

30. A logic circuit system, comprising:

at least one first logic circuit to receive first data and to output second data manipulated by the first logic circuit;

a semi-dynamic flip flop circuit to receive the second data and to output for a predetermined period of time, the semi-dynamic flip-flop circuit comprising:

an internal clock generator to receive a clock signal, a scan enable signal, and a first input signal, and to output an internal timing signal based on each of the clock signal, the scan enable signal, and the first input signal;

a dynamic input unit to receive a second input signal corresponding to the second data, the scan enable signal, a first timing signal, and the internal timing signal, and to output a first output signal, the dynamic input unit including a first MOS transistor and at least one second MOS transistor connected in parallel with the first MOS transistor, the scan enable signal being connected to a gate of the first MOS transistor and the second input signal being connected to a gate of the at least one second MOS transistor; and a static output unit to receive the first timing signal and the first output signal and to output a static output signal; and at least one second logic circuit to receive the second data output from the static output unit of the semi-dynamic flip-flop circuit when the static output signal corresponds to the second data and to output third data corresponding to the second data manipulated by the at least one second logic circuit, wherein the dynamic input unit outputs the first output signal corresponding to one of the first input signal and the second input signal, respectively, based on a status of the scan enable signal.

31. The logic circuit system according to claim 30, further comprising:

wiring connected an output of the static output unit to bypass the at least one second logic circuit.

32. The logic circuit system according to claim 30, wherein each of the first logic circuit, the semi-dynamic flip-flop circuit, and the at least one second logic circuit is located on a same semiconductor chip.

33. A flip-flop circuit having a scan function, the flip-flop circuit comprising:

an internal clock generator to receive a clock signal, a scan enable signal, and a first input signal, and to output an internal timing signal based on each of the clock signal, the scan enable signal, and the first input signal;

a dynamic input unit to receive a second input signal, the scan enable signal, a first timing signal, and the internal timing signal, the dynamic input unit including:

a first NMOS to receive the scan enable signal as a gate input;

at least one second NMOS connected parallel to the first NMOS, the at least one second NMOS to receive the second input signal as a gate input;

a third NMOS connected in series with the first and second NMOS, the third NMOS to receive the first timing signal as a gate input; and a fourth NMOS connected in series with the third NMOS, the fourth NMOS to receive the internal timing signal as a gate input; and a static output unit to receive the first timing signal and the first output signal, wherein the first through fourth NMOS transistors are connected between the first output signal at one end and ground at the other end, and the dynamic input unit outputs the first output signal corresponding to one of the first input signal and the second input signal, respectively, based on a status of the scan enable signal.

34. A flip-flop circuit having a scan function, the flip-flop circuit comprising:

an internal clock generator to receive a clock signal, a scan enable signal, and a first input signal, and to output an internal timing signal based on each of the clock signal, the scan enable signal, and the first input signal;

a dynamic input unit to receive a second input signal, the scan enable signal, a first timing signal, and the internal timing signal, and to output a first output signal; and a static output unit to receive the first timing signal and the first output signal and to output a static output signal, wherein the dynamic input unit outputs the first output signal corresponding to one of the first input signal and the second input signal, respectively, based on a status of the scan enable signal, and the internal timing generator comprises:

a first NOR logic gate to receive the first input signal and the scan enable signal and to output an intermediate signal; and a second NOR gate to receive a delayed clock signal and the intermediate signal and to output the internal timing signal.

* * * * *

UNITED STATES PATENT AND TRADEMARK OFFICE
CERTIFICATE OF CORRECTION

| | | |
|---|---|---|
| PATENT NO. | : 7,994,823 B2 | Page 1 of 1 |
| APPLICATION NO. | : 12/795916 | |
| DATED | : August 9, 2011 | |
| INVENTOR(S) | : Hyoung Wook Lee et al. | |

It is certified that error appears in the above-identified patent and that said Letters Patent is hereby corrected as shown below:

On the Title Page, insert

Item -- (30) Foreign Application Priority Data
June 9, 2009 (KR).....10-2009-0050999 --

Signed and Sealed this
Fifth Day of June, 2012

David J. Kappos
*Director of the United States Patent and Trademark Office*